United States Patent
Hidaka

[19]

[11] Patent Number: 5,831,247
[45] Date of Patent: Nov. 3, 1998

[54] APPARATUS AND METHOD FOR PRODUCING AN ELECTRONIC COMPONENT PROVIDED WITH BUMPS

[75] Inventor: Masao Hidaka, Onojo, Japan

[73] Assignee: Matsushita Electric Industrial Co., Ltd., Osaka, Japan

[21] Appl. No.: 661,615

[22] Filed: Jun. 11, 1996

[30] Foreign Application Priority Data

Jun. 19, 1995 [JP] Japan ................................. 7-151579

[51] Int. Cl.$^6$ ................ F27B 9/06; B23K 3/06; B23K 3/08
[52] U.S. Cl. .............. 219/388; 219/85.12; 219/85.18; 219/85.19; 219/85.22; 228/180.21; 228/180.22; 228/246; 228/41
[58] Field of Search ................ 219/388, 85.12, 219/88.13, 88.17, 85.18, 85.19, 85.22; 228/180.1, 180.21, 180.22, 180.5, 245, 246, 41; 29/740, 741, 743

[56] References Cited

U.S. PATENT DOCUMENTS

| | | | |
|---|---|---|---|
| 4,871,110 | 10/1989 | Fukasawa et al. | 228/245 |
| 5,431,332 | 7/1995 | Kirby et al. | 228/246 |
| 5,445,313 | 8/1995 | Boyd et al. | 228/180.22 |
| 5,467,913 | 11/1995 | Namekawa et al. | 228/246 |
| 5,506,385 | 4/1996 | Murakami et al. | 219/85.12 |
| 5,540,377 | 7/1996 | Ito | 228/41 |
| 5,574,801 | 11/1996 | Collet-Beillon | 382/150 |
| 5,611,491 | 3/1997 | Bowers | 239/582.1 |
| 5,652,658 | 7/1997 | Jackson et al. | 356/398 |

FOREIGN PATENT DOCUMENTS 6310515  11/1994  Japan.
WO94/28580  12/1994  WIPO.

*Primary Examiner*—Teresa J. Walberg
*Assistant Examiner*—J. Pelham
*Attorney, Agent, or Firm*—Stevens, Davis, Miller & Mosher, L.L.P.

[57] ABSTRACT

The invention provides an apparatus and a method for producing an electronic component provided with bumps, in which the operation of placing a solder ball serving as a material of a bump onto an electrode of a work is monitored, and if a solder ball placing failure is detected, a recovering operation is automatically performed. In the apparatus and method of the invention, a head is moved to a location above a solder ball supplying unit so as to pick up solder balls by means of suction. The head is then moved to a location above a flux reservoir so that the solder balls are coated with flux. The head is further moved to a location above a substrate and the solder balls are placed on electrodes of the substrate. The substrate is then observed using a camera to decide whether solder balls are correctly placed on the electrodes. If yes, the substrate is transferred into a heating furnace. On the other hand, if a solder ball placing failure is detected, the solder balls are removed using a nozzle and the step of placing solder balls is performed again.

35 Claims, 5 Drawing Sheets

APPARATUS AND METHOD FOR PRODUCING AN ELECTRONIC COMPONENT PROVIDED WITH BUMPS

BACKGROUND OF THE INVENTION

1. Field of the Invention

The present invention relates to an apparatus and a method for producing an electronic component provided with bumps, including the step of placing a conductive ball, e.g., a solder ball, on an electrode of a work to form a bump.

2. Description of the Related Art

In production of an electronic component having bumps, it is known in the art to employ a solder ball to form a bump (protruding electrode) on a work such as a substrate. In this technique, a solder ball is picked up, using transfer means such as a head, from a solder supplying unit, and transferred onto an electrode of a work. The work is then heated in a heating furnace so as to fuse the solder ball. The solder ball is then solidified to form a bump on the electrode.

This technique has the advantage that bumps can be simultaneously formed on a plurality of electrodes of a work in one operation step. However, when the transfer means such as a head places solder balls on electrodes of a work, the transfer means sometimes fails to correctly place some solder ball at a desired location. For example, some solder balls moves to an incorrect location greatly deviated from a correct location on an electrode. Furthermore, in some cases, no solder ball is placed on an electrode. If such a failure occurs during the operation of placing a solder ball, an operator removes the solder ball for example by sweeping the surface of the work with cleaning means such as a brush, and then places another solder ball on the electrode of the work.

However, this conventional technique imposes a heavy and slow task on the operator in the operation of manually removing solder balls using cleaning means.

SUMMARY OF THE INVENTION

In view of the above, it is an object of the present invention to provide an apparatus and a method for producing an electronic component provided with bumps, which makes it possible to automatically deal with a conductive ball, e.g., a solder ball, placing failure.

In one aspect of the present invention, there is provided an apparatus for producing an electronic component provided with bumps, wherein the apparatus includes: a solder ball supplying unit including conductive balls; a work positioning device; transfer means for transferring at least one conductive ball; moving means for moving the transfer means between the conductive ball supplying unit and the work positioning device; recognition means for recognizing the conductive ball placed on an electrode formed on the upper surface of the work; removing means for removing the conductive ball from the upper surface of the work; and moving means for moving the removing means horizontally.

The apparatus may further include a heating furnace for heating the work so as to fuse the conductive ball placed on the electrode of the work thereby forming a bump on the electrode.

In another aspect of the present invention, there is provided a method of producing an electronic component provided with bumps, including the steps of: picking up, with transfer means, a conductive ball from a conductive ball supplying unit and placing the conductive ball on an electrode of a work positioned on a positioning device; recognizing the upper surface of the work using recognition means, and inspecting whether the electrode has the conductive ball placed at a correct location on the electrode on the basis of the recognition result; and if a conductive ball placing failure is detected in the previous step, removing the conductive ball from the work using conductive ball removing means.

The method may further includes the step of forming a work having an electrode on which a bump is to be formed. Furthermore, the method may include the step of heating the work on which the conductive ball has been placed, using a heating furnace, so as to fuse the conductive ball on the electrode and then solidifying the conductive ball thereby forming a bump.

In the above-described apparatus and method according to the present invention, inspection is performed using the recognition means to determine whether conductive balls are correctly placed on electrodes of a work, and if a conductive ball placing failure is detected, the removing means removes conductive balls from the work. When such a conductive ball placing failure is detected, all conductive balls including correctly-placed balls are preferably removed from the electrodes of the work in one operation, and then immediately the step of placing conductive balls on the work is performed again using the transfer means.

DESCRIPTION OF THE PREFERRED EMBODIMENTS

Figure 1A:
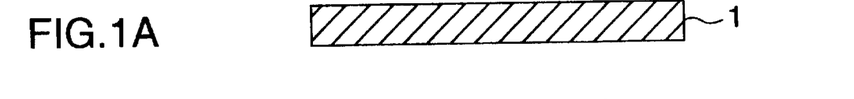
FIGS. 1A, 1B, 1C, 1D, 1E, 1F and 1G are schematic diagrams illustrating a sequence of steps producing an electronic component having bumps, according to a first embodiment according to the present invention.
Figure 1B:
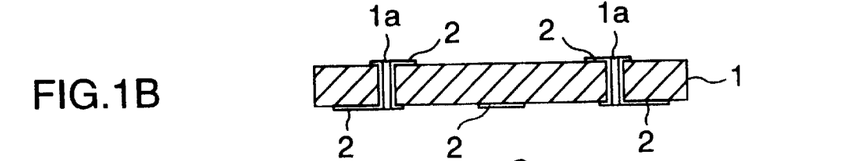
Figure 1C:
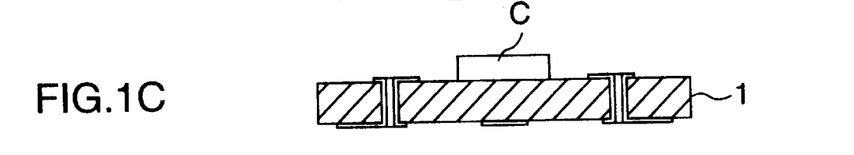
Figure 2:
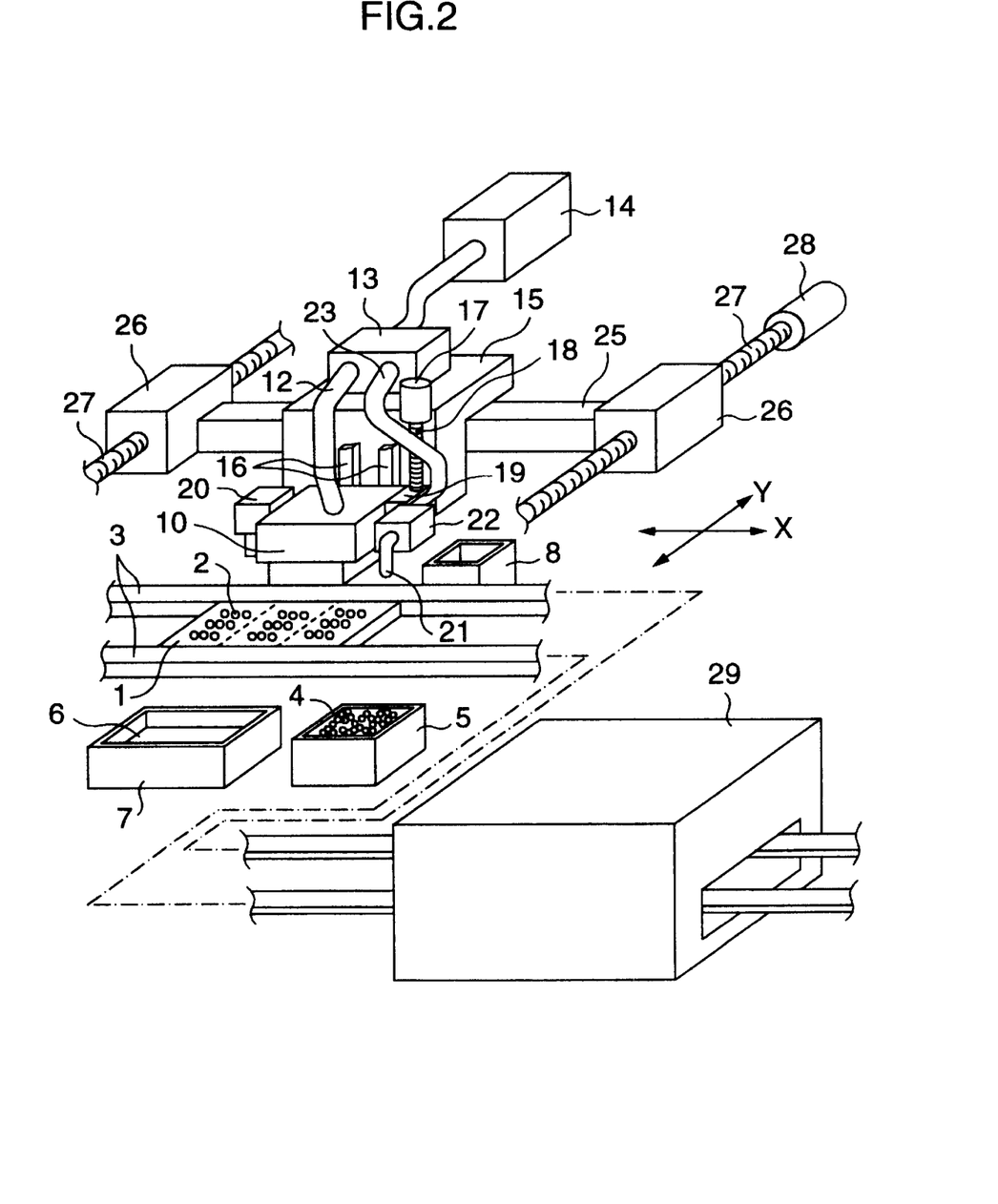
FIG. 2 is a perspective view of an apparatus for producing an electronic component having bumps, according to the first embodiment of the invention.
Figure 3:
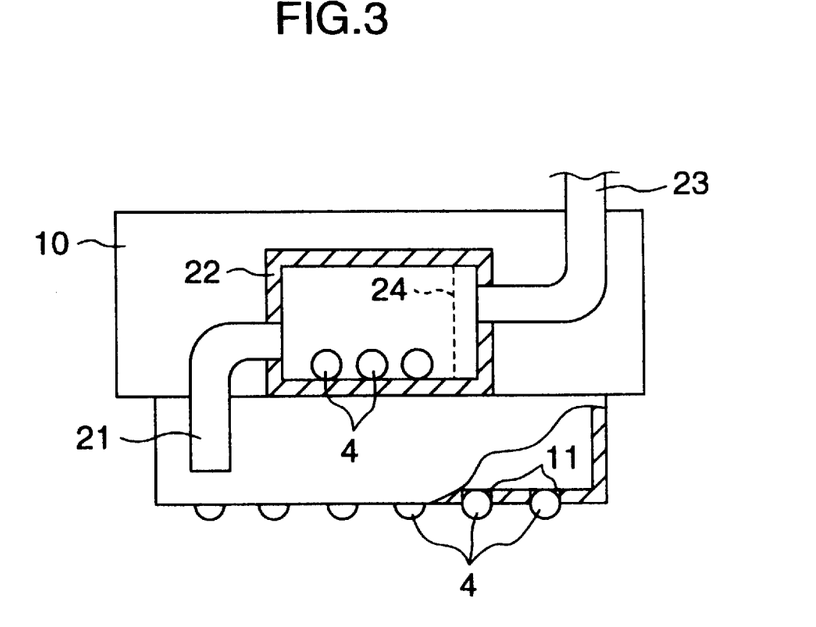
FIG. 3 is a cross-sectional view illustrating the head of the apparatus for producing an electronic component having bumps, according to the first embodiment of the invention.
Figure 4:
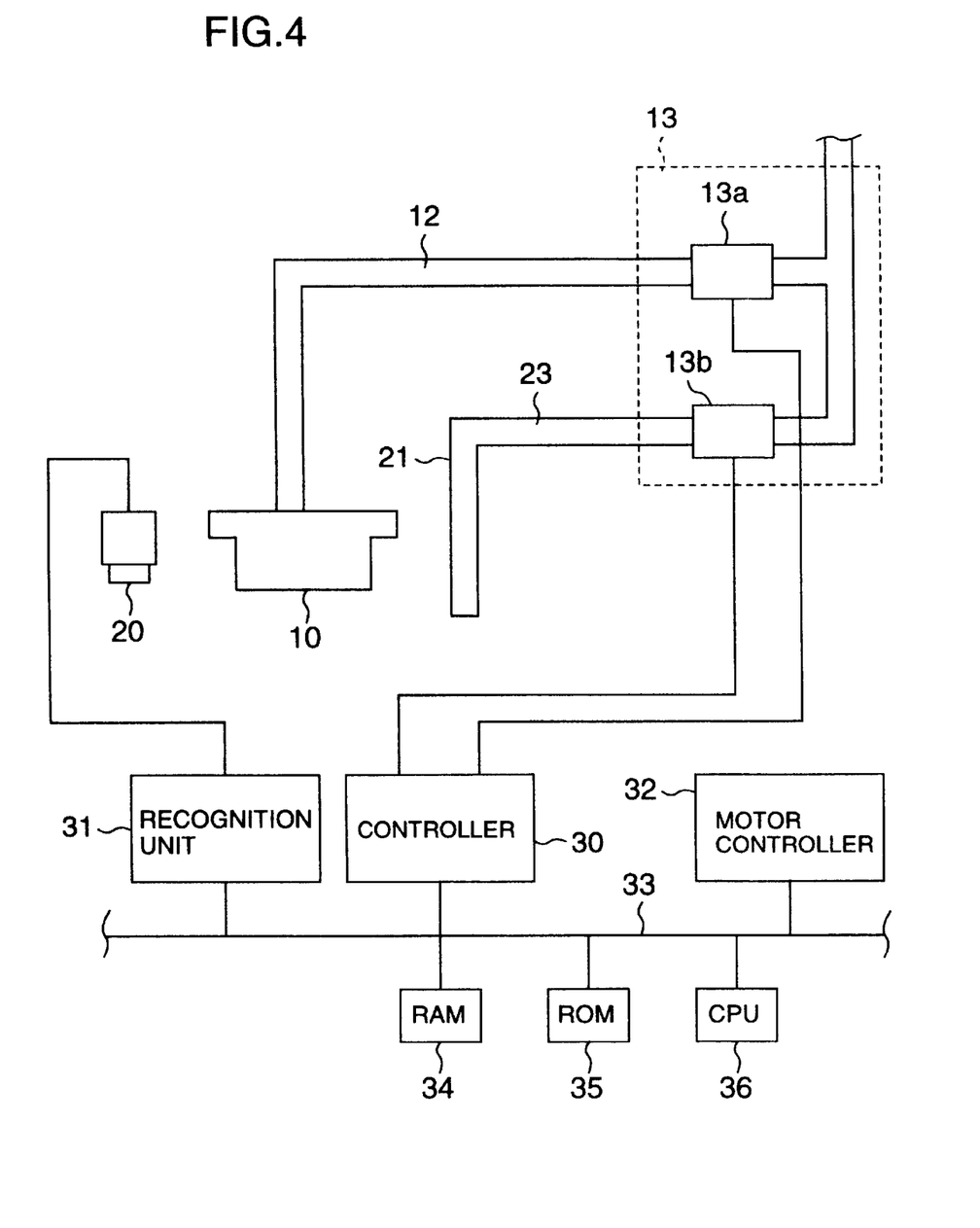
FIG. 4 is a block diagram illustrating the control system of the apparatus for producing an electronic component having bumps, according to the first embodiment of the invention.
Figure 5:
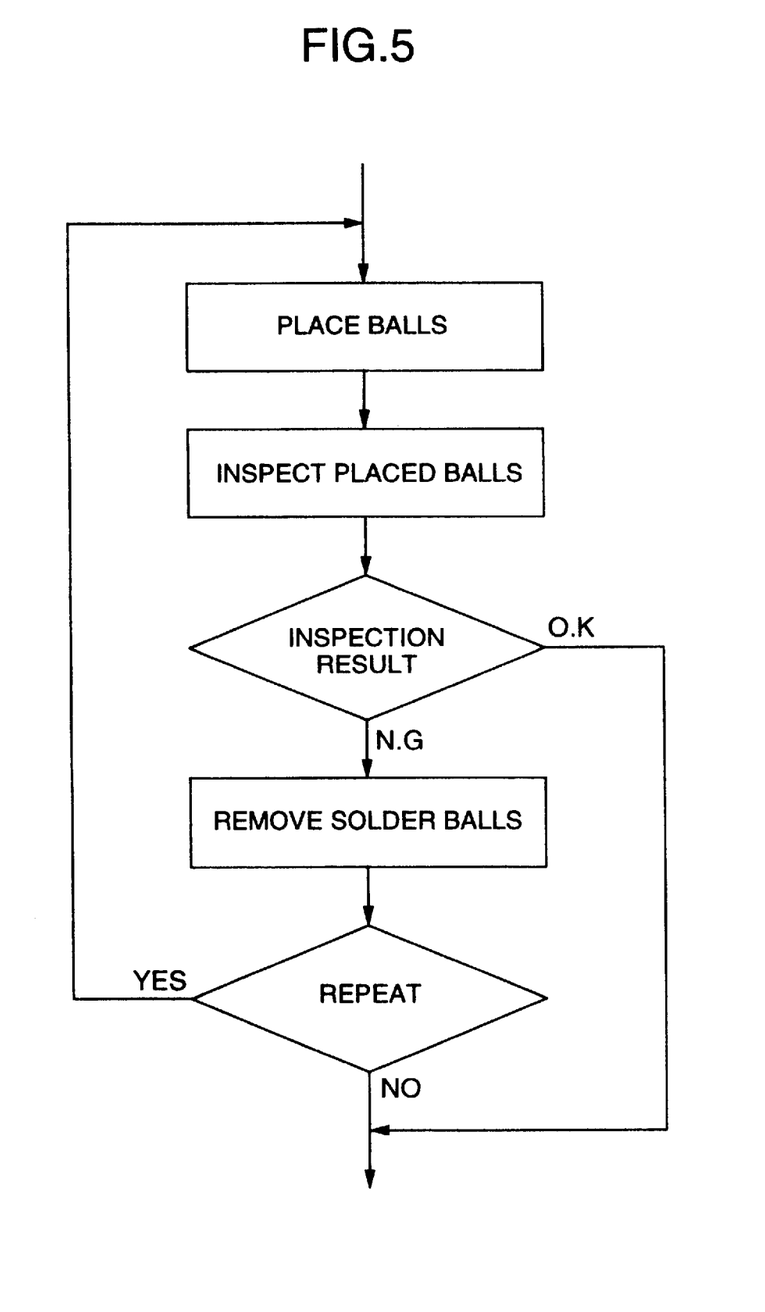
FIG. 5 is a flow chart illustrating the operation of the apparatus for producing an electronic component having bumps, according to the first embodiment of the invention.

The present invention will be described in greater detail below with reference to specific embodiments in connection with the accompanying drawings. FIGS. 1A, 1B, 1C, 1D, 1E, 1F and 1G illustrate a sequence of steps producing an electronic component having bumps according to a first embodiment of the present invention. FIG. 2 is a perspective view of an apparatus for producing an electronic component having bumps according to the first embodiment of the invention. FIG. 3 is a cross-sectional view illustrating the head of the apparatus shown in FIG. 2 for producing an electronic component having bumps. FIG. 4 is a block diagram illustrating the control system of the apparatus shown in FIG. 2. FIG. 5 is a flow chart illustrating the operation of the apparatus shown in FIG. 2. First, the entire process for producing an electronic component having bumps will be briefly described with reference to FIG. 1. In FIG. 1A, reference numeral 1 denotes a substrate serving as a work. As shown in FIG. 1B, the front electrodes 2 and the back electrodes 2 are formed on the upper and lower surfaces of the substrate. Furthermore, through-holes 1a are formed so that the front and back electrodes 2 are electrically connected to each other via the through-holes 1a. Although three substrate units are produced from the substrate 1 at a time with reference to FIG. 2, as will be described later, only one substrate unit of the substrate 1 is shown in FIGS. 1A–1G.

Figure 1D:
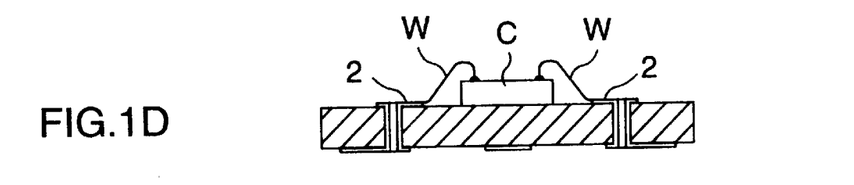
Figure 1E:
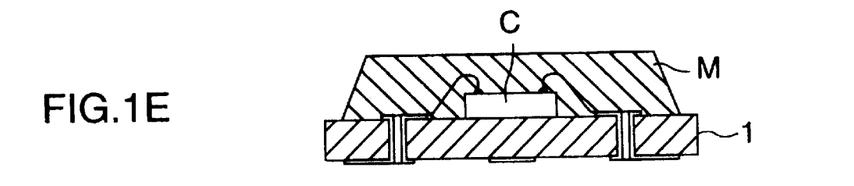
Figure 1F:
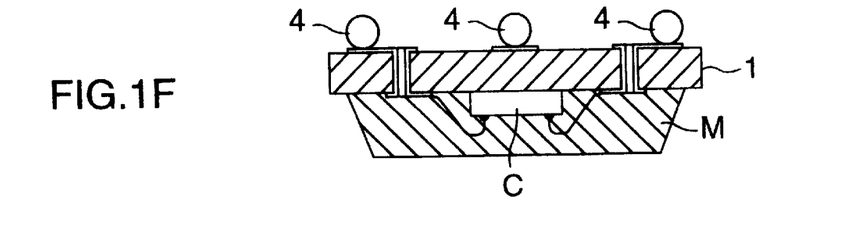
Figure 1G:
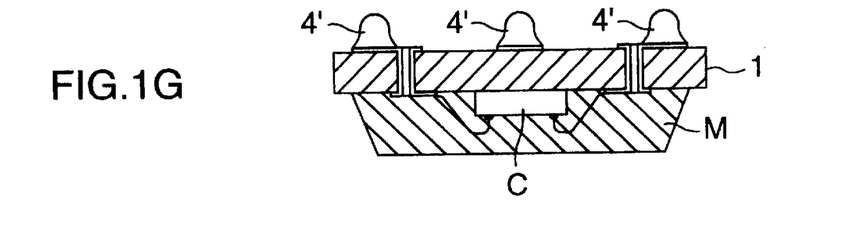

A chip C is then placed on the upper surface of the substrate 1 (FIG. 1C), and wires W are connected so as to realize electrical connections between electrodes on the upper surface of the chip C and the electrodes 2 on the upper surface of the substrate 1 (FIG. 1D). The upper side of the substrate is then covered with a molding material M such as synthetic resin so that the chip C and wires W are protected by the molding material M (FIG. 1E). The substrate 1 is turned upside down, and conductive balls, i.e., solder balls 4, are placed on the electrodes 2 (FIG. 1F). The substrate 1 is then placed in a furnace and heated so that the solder balls 4 are fused and then solidified thereby forming bumps 4' (FIG. 1G).

Thus, a complete electronic component provided with bumps is obtained. The process of placing solder balls 4 on the electrodes 2 and forming bumps 4' briefly described above in connection with FIGS. 1F and 1G will be described in further detail below.

In FIG. 2, reference numeral 1 denotes a substrate which is the same as that shown in FIG. 1E wherein the substrate 1 is placed upside down. In FIG. 2, the lower surface of the substrate 1 is covered with a molding material M so that the chip C is enclosed therein. The substrate 1 includes a plurality of substrate units (three units in this specific example). After completion of the process of forming bumps, the substrate 1 is cut along broken lines in the drawing and thus divided into three units. Reference numeral 3 denotes guide rails serving as positioning means. The substrate 1 is clamped from its both sides by the guide rails 3 so that the substrate 1 is fixed at a desired location. The guide rails 3 are also used to transport the substrate 1 in the right direction in FIG. 2.

By a side of a guide rail 3, there are provided a solder ball supplying unit 5 and a reservoir 7 of flux 6. A great number of solder balls 4 are placed in the supplying unit 5. By the other side of the rails 3, there is a box serving as a solder ball collecting unit 8.

Reference numeral 10 denotes a head serving as solder ball transfer means having a large number of suction holes 11 for sucking and holding solder balls 4 wherein the suction holes 11 are arranged in a matrix form on the lower surface of the head (see also FIG. 3). The head 10 is connected to a blower 14 via a tube 12 and a valve unit 13. The head 10 is held by a bracket via guide rails 16 in such a manner that the head 10 can move up and down along the guide rails 16. A motor 17 is disposed on the bracket 15 so that a ball screw 18 disposed vertically is rotated by the motor 17 wherein the ball screw 18 meshes with a nut 19 disposed on a side of the head 10. When the motor 17 rotates in a forward or reverse direction, the head 10 moves upward or downward along the guide rails 16 in response to the rotation of the motor 17. As for the solder ball transfer means, other techniques may also be employed in stead of the head 10 described above. For example, an adhesive tape may be used to transfer solder balls by means of adhesion.

As shown in FIGS. 2 and 3, a nozzle 21 is disposed on a side of the head 10. The nozzle 21 is connected to a ball reservoir 22 which is in turn connected to the valve unit 13 via a tube 23. There is also provided a filter 24 between the ball reservoir 22 and the tube 23. The nozzle 21 serves as removing means for sucking a solder ball 4 and removing it from the substrate 1. On the other side of the head 10, there is provided a camera 20 serving as recognition means, which is an integral part of the head 10.

The bracket 15 is held on a linear motor 25 extending in the X-direction in FIG. 2. Both ends of the linear motor 25 are connected to nuts 26 which in turn mesh with ball screws 27 extending in the Y-direction in FIG. 2. Reference numeral 28 denotes a motor for rotating the ball screw 27. The head 10 can be driven horizontally in the X-direction by the linear motor 25 and in the Y-direction by the motor 28. In the motion of the head 10, the nozzle 21 and the camera 20 integrated with the head 10 move in the X- or Y-direction together with the head 10. Thus, the linear motor 25, nuts 26, ball screws 27, and the motor 28 serve as moving means for horizontally moving the head 10 and elements integrated therewith.

A heating furnace 29 is disposed on a downstream side of the guide rails 3. A heater and a fan are provided in the heating furnace 29 so that the substrate 1 may be heated when it passes through the heating furnace 29.

In FIG. 4, the valve unit 13 includes a valve 13a connected to the tube 12 and a valve 13b connected to the tube 23 wherein these valves 13a and 13b are independently opened and closed under the control of a controller 30. The camera 20 is connected to a recognition unit 31 so that image data acquired via the camera 20 is supplied to the recognition unit 31 which in turn performs recognition operation on the basis of the supplied data. The motors 17 and 28 are controlled by a motor controller 32. The controller 30, the recognition unit 31, and the motor controller 32 are connected via a bus 33 to RAM 34, ROM 35, and CPU 36. The RAM 34 is used to store numerical data and other required data. The ROM 35 stores a program or the like. The CPU 36 is responsible for the control of the operation of the entire apparatus.

The operation steps shown in FIGS. 1F and 1G performed with the above-described production apparatus for producing an electronic component having bumps will be described in further detail below. In FIG. 2, after a substrate 1 has been positioned at a predetermined location on the guide rails 3, the head 10 moves to a location above the supplying unit 5. The head 10 then moves down and picks up solder balls 4 by means of suction via suction holes 11. Then the head 10 moves upward together with the sucked solder balls, and moves to a location above the reservoir 7. The head 10 then moves downward so that the surfaces of lower portions of the solder balls are coated with flux 6. The head 10 then rises up to the original height, and moves to a location above the substrate 1. Then the head 10 moves down and releases the sucked solder balls 4 thereby placing, in one operation, a great number of solder balls 4 (3×3=9 solder balls in this specific example) on the electrodes 2 of the substrate 1 (FIG. 1F).

The camera 20 moves to a location above the substrate 1 so that the upper surface of the substrate 1 is observed. The image data of the upper surface of the substrate 1 is transmitted to the recognition unit 31. The CPU 36 decides whether the solder balls are correctly placed on all electrodes 2 on the basis of the image data given to the recognition unit 31. If yes, then the substrate 1 is transferred into the heating furnace 29 and heated. In the heating process, the solder balls 4 on the electrodes 2 of the substrate 1 are fused. The substrate 1 is then cooled so that the solder balls 4 are solidified thereby forming bumps on the electrodes 2. In this specific example, since one sheet of substrate 1 includes three substrate units, 3×3=9 solder balls are placed on each of three substrate units and then the substrate units are transferred into the heating furnace 29.

In the above inspection step, if the CPU 36 concludes that the image data obtained via the camera 20 indicates that there is some failure as in the case where one or more solder balls 4 are placed on incorrect locations deviated from the correct positions on the electrodes 2 or as in the case where no solder ball 4 is on some electrode 2, then the nozzle 21 is moved to a location above the substrate 1 so as to suck the solder balls 4 and remove them from the surface of the substrate 1 into the ball reservoir 22. In this operation, all of 3×3=9 solder balls including the miss-placed one, i.e., all solder balls within an area wherein the balls are placed by the head 10 in one operation are removed so that another set of solder balls may be placed in a re-operation using the head 10.

The head 10 moves to the location above the supplying unit 5 to re-pick up solder balls 4, and then moves to the location above the reservoir 7 so that the surfaces of lower portions of the solder balls 4 are coated with flux 6. The head 10 then moves to the location above the substrate 1 and places again the solder balls 4 on the electrodes 2. The substrate 1 is observed via the camera 20 and the operation described above is repeated. If the solder balls 4 have been placed successfully, then the substrate 1 is transferred into the heating furnace 29 so as to form bumps 4' as shown in FIG. 1G. Thus, a complete electronic component provided with bumps is obtained.

The head 10 is moved until the nozzle 21 comes to the location above the restoring unit 8, and then the blower 14 is operated in the reverse direction so that the solder balls 4 which have been restored into the ball reservoir 22 in FIG. 3 are dropped down via the nozzle 21 into the restoring unit 8.

Figure 6:
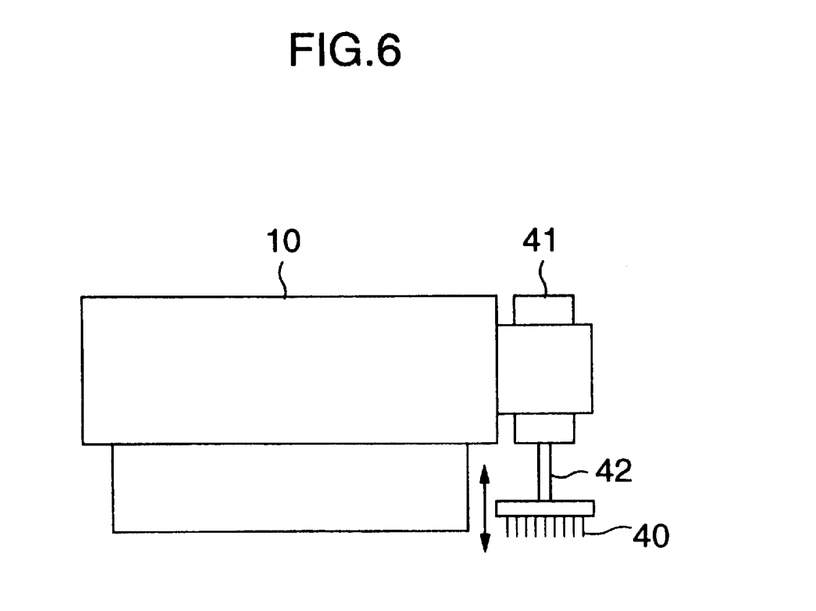
FIG. 6 is a side view illustrating a second embodiment of a head installed on an apparatus for producing an electronic component provided with bumps, according to the present invention.

FIG. 6 is a side view illustrating a second embodiment of a head installed on an apparatus for producing an electronic component provided with bumps, according to the present invention. The head 10 has removing means such as a brush 40 instead of the nozzle 21 described above. The brush 40 is connected to a rod 42 extending from a cylinder 41. In operation, the rod 42 is protruded so that the brush 40 moves down until the brush comes into contact with the upper surface of the substrate 1. The brush 40 is then moved in a horizontal direction so that solder balls 4 on the substrate 1 are swept out. In the first embodiment described earlier, the nozzle 21 may be adapted to move up and down so that the lower end of the nozzle 21 may come into contact with the upper surface of the substrate 1 thereby ensuring that the nozzle may suck solder balls in a more reliable fashion.

In the present invention, as described above, the operation of placing solder balls on a work is monitored, and if a failure is detected solder balls are automatically removed and a recovering operation is performed. In the recovering operation, all solder balls are removed from the work so that the head may immediately perform a re-operation of placing solder balls. This leads to a great improvement in productivity in manufacturing electronic components provided with bumps.

What is claimed is:

1. An apparatus for producing an electronic component provided with bumps, said apparatus comprising:
   a conductive ball supplying unit for supplying a plurality of conductive balls;
   a work positioning device for positioning a workpiece;
   transfer means for transferring the plurality of conductive balls at one time from the conductive ball supplying unit to the workpiece;
   moving means for moving said transfer means between said conductive ball supplying unit and said work positioning device;
   recognition means for recognizing said conductive balls placed on electrodes formed on an upper surface of said workpiece to determine whether the balls are placed in correct locations on the upper surface; and
   removing means for removing all of the conductive balls from the upper surface of said
   workpiece when the recognition means determines that at least one of the balls is not placed in one of the correct locations.

2. An apparatus for producing an electronic component provided with bumps, said apparatus comprising:
   a conductive ball supplying unit for supplying a plurality of conductive balls;
   a work positioning device for positioning a workpiece;
   transfer means for transferring the plurality of conductive balls at one time from the conductive ball supplying unit to the workpiece;
   moving means for moving said transfer means between said conductive ball supplying unit and said work positioning device;
   recognition means for recognizing said conductive balls placed on electrodes formed on the upper surface of said workpiece to determine whether the balls are placed in correct locations on the upper surface;
   removing means for removing all of the conductive balls from the upper surface of said workpiece when the recognition means determines that at least one of the balls is not placed in one of the correct locations;
   and a heating furnace for heating said workpiece so as to fuse the conductive balls placed on the electrodes of said workpiece thereby forming the bumps on said electrodes.

3. An apparatus for producing an electronic component provided with bumps, according to claim 1, wherein said transfer means comprises a head provided with suction holes for sucking said conductive balls, said suction holes being formed on a lower side of said head, said head being connected to a blower portion.

4. An apparatus for producing an electronic component provided with bumps, according to claim 2, wherein said transfer means comprises a head provided with suction holes for sucking said conductive balls, said suction holes being formed on a lower side of said head, said head being connected to a blower portion.

5. An apparatus for producing an electronic component provided with bumps, according to claim 3, wherein said recognition means and said removing means are integrated with said head, and said head, said recognition means and said removing means are moved horizontally by common moving means.

6. An apparatus for producing an electronic component provided with bumps, according to claim 4, wherein said recognition means and said removing means are integrated with said head, and said head, said recognition means and said removing means are moved horizontally by common moving means.

7. An apparatus for producing an electronic component provided with bumps, according to claim 1, wherein said removing means comprises a suction means for sucking said conductive balls.

8. An apparatus for producing an electronic component provided with bumps, according to claim 2, wherein said removing means comprises a suction means for sucking said conductive balls.

9. An apparatus for producing an electronic component provided with bumps, according to claim 3, wherein said removing means comprises a suction means for sucking said conductive balls.

10. An apparatus for producing an electronic component provided with bumps, according to claim 4, wherein said removing means comprises a suction means for sucking said conductive balls.

11. An apparatus for producing an electronic component provided with bumps, according to claim 5, wherein said removing means comprises a suction means for sucking said conductive balls.

12. An apparatus for producing an electronic component provided with bumps, according to claim 6, wherein said removing means comprises a suction means for sucking said conductive balls.

13. An apparatus for producing an electronic component provided with bumps, according to claim 7, wherein said suction means is connected to said blower portion, and said blower portion is used in common by said suction means and said head.

14. An apparatus for producing an electronic component provided with bumps, according to claim 8, wherein said suction means is connected to said blower portion, and said blower portion is used in common by said suction means and said head.

15. An apparatus for producing an electronic component provided with bumps, according to claim 9, wherein said suction means is connected to said blower portion, and said blower portion is used in common by said suction means and said head.

16. An apparatus for producing an electronic component provided with bumps, according to claim 10, wherein said suction means is connected to said blower portion, and said blower portion is used in common by said suction means and said head.

17. An apparatus for producing an electronic component provided with bumps, according to claim 11, wherein said suction means is connected to said blower portion, and said blower portion is used in common by said suction means and said head.

18. An apparatus for producing an electronic component provided with bumps, according to claim 12, wherein said suction means is connected to said blower portion, and said blower portion is used in common by said suction means and said head.

19. An apparatus for producing an electronic component provided with bumps, according to claim 1, further comprising a collecting unit for collecting said conductive balls removed by said removing means from said work.

20. An apparatus for producing an electronic component provided with bumps, according to claim 2, further comprising a collecting unit for collecting said conductive balls removed by said removing means from said work.

21. A method of producing an electronic component provided with bumps, said method comprising the steps of:

(a) picking up, with transfer means, a plurality of conductive balls from a conductive ball supplying unit at one time and placing said conductive balls on electrodes of a workpiece positioned on a positioning device;

(b) recognizing an upper surface of said workpiece using recognition means, and inspecting whether each of said electrodes has one of said conductive balls placed at a correct location on said each of said electrodes in accordance with a recognition result; and (c) if step (b) determines that one of the balls is not placed at the correct location, removing all of the conductive balls from said workpiece using conductive ball removing means.

22. A method of producing an electronic component provided with bumps, including the steps of forming a workpiece provided with electrodes on which the bumps are to be formed; and forming the bumps on said electrodes, said method being characterized in that said method includes the steps of:

(a) picking up, with transfer means, a plurality of conductive balls from a conductive ball supplying unit at one time and placing said conductive balls on the electrodes of the workpiece positioned on a positioning device;

(b) recognizing an upper surface of said workpiece using recognition means, and inspecting whether each of said electrodes has one of said conductive balls placed at a correct location on said each of said electrodes in accordance with a recognition result; and (c) if step (b) determines that one of the balls is not placed at the correct location, removing all of the conductive balls from said workpiece using conductive ball removing means.

23. A method of producing an electronic component provided with bumps, said method comprising the steps of:

(a) picking up, with transfer means, a plurality of conductive balls from a conductive ball supplying unit at one time;

(b) moving said transfer means to a location above a workpiece positioned on a positioning device, and placing said conductive balls on electrodes of said workpiece;

(c) recognizing an upper surface of said workpiece using recognition means, and inspecting whether each of said electrodes has one of said conductive balls placed at a correct location on said each of said electrodes in accordance with a recognition result;

(d) if step (c) determines that at least one of the balls is not in the correct location, removing all of the conductive balls from said workpiece using conductive ball removing means; and (e) heating the workpiece on which said conductive balls have been placed, using a heating furnace, so as to fuse said conductive balls on the electrodes and then solidifying said conductive balls thereby forming the bumps.

24. A method of producing an electronic component provided with bumps, according to claim 21, wherein said removing means comprises a suction means for sucking said conductive balls.

25. A method of producing an electronic component provided with bumps, according to claim 22, wherein said removing means comprises a suction means for sucking said conductive balls.

26. A method of producing an electronic component provided with bumps, according to claim 23, wherein said removing means comprises a suction means for sucking said conductive balls.

27. A method of producing an electronic component provided with bumps, according to claim 21, wherein in step (a), placing the balls on the workpiece is performed using said transfer means.

28. A method of producing an electronic component provided with bumps, according to claim 22, wherein in step (a), placing the balls on the workpiece is performed using said transfer means.

29. A method of producing an electronic component provided with bumps, according to claim 23, wherein in step (b), placing the balls on the workpiece is performed using said transfer means.

30. An apparatus for producing an electronic component provided with bumps, said apparatus comprising:
   a conductive ball supplying unit for supplying conductive balls;
   a work positioning device for positioning a workpiece;
   transfer means for transferring at least one of the conductive balls from the supplying unit to the workpiece;
   moving means for moving said transfer means between said conductive ball supplying unit and said work positioning device;
   recognition means for recognizing said conductive ball placed on an electrode formed on an upper surface of said workpiece;
   removing means for removing the conductive ball from the upper surface of said workpiece; and
   moving means for moving said removing means horizontally;
   wherein said transfer means is a head provided with a suction hole for sucking said conductive ball, said suction hole being formed on a lower side of said head, said head being connected to a blower portion; and
   wherein said recognition means and said removing means are integrated with said head, and said head, said recognition means and said removing means are moved horizontally by common moving means.

31. An apparatus for producing an electronic component provided with bumps, said apparatus comprising:
   a conductive ball supplying unit for supplying conductive balls;
   a work positioning device for positioning a workpiece;
   transfer means for transferring at least one of the conductive balls from the supplying unit to the workpiece;
   moving means for moving said transfer means between said conductive ball supplying unit and said work positioning device;
   recognition means for recognizing said conductive ball placed on an electrode formed on an upper surface of said workpiece;
   removing means for removing the conductive ball from the upper surface of said workpiece;
   moving means for moving said removing means horizontally; and
   a heating furnace for heating said workpiece so as to fuse the conductive ball placed on the electrode of said workpiece thereby forming a bump on said electrode;
   wherein said transfer means is a head provided with a suction hole for sucking said conductive ball, said suction hole being formed on a lower side of said head, said head being connected to a blower portion; and
   wherein said recognition means and said removing means are integrated with said head, and said head, said recognition means and said removing means are moved horizontally by common moving means.

32. An apparatus for producing an electronic component provided with bumps, according to claim 30, wherein said removing means comprises a suction means for sucking said conductive ball.

33. An apparatus for producing an electronic component provided with bumps, according to claim 31, wherein said removing means comprises a suction means for sucking said conductive ball.

34. An apparatus for producing an electronic component provided with bumps, according to claim 32, wherein said suction means is connected to said blower portion, and said blower portion is used in common by said suction means and said head.

35. An apparatus for producing an electronic component provided with bumps, according to claim 33, wherein said suction means is connected to said blower portion, and said blower portion is used in common by said suction means and said head.

* * * * *